United States Patent [19]

Kimbara

[11] Patent Number: 5,111,003
[45] Date of Patent: May 5, 1992

[54] MULTILAYER WIRING SUBSTRATE

[75] Inventor: Kohji Kimbara, Tokyo, Japan

[73] Assignee: NEC Corporation, Tokyo, Japan

[21] Appl. No.: 665,938

[22] Filed: Mar. 6, 1991

Related U.S. Application Data

[63] Continuation of Ser. No. 401,115, Sep. 1, 1989, abandoned.

[30] Foreign Application Priority Data

Sep. 2, 1988 [JP] Japan .................. 63-220869

[51] Int. Cl.⁵ .............................. H05K 1/00
[52] U.S. Cl. ................... 174/255; 174/257; 174/258; 174/259; 361/414; 428/201; 428/209; 428/210; 428/428; 428/429; 428/434; 428/435; 428/458; 428/473.5; 428/477.7; 428/624; 428/628; 428/670; 428/672; 428/698

[58] Field of Search ............... 428/201, 209, 210, 428, 428/429, 434, 435, 458, 473.5, 477.7, 624, 670, 672, 698, 628; 174/251, 257, 259, 262, 255, 258; 361/414

[56] References Cited

U.S. PATENT DOCUMENTS 4,594,473 6/1986 Inoue et al. .................. 428/901

FOREIGN PATENT DOCUMENTS 2601501 7/1986 France .................. 361/314

Primary Examiner—Merrell C. Cashion, Jr.
Assistant Examiner—D. S. Nakarani
Attorney, Agent, or Firm—Burns, Doane, Swecker & Mathis

[57] ABSTRACT

A multilayer wiring substrate which includes a glass ceramic section, a wiring layer section having a plurality of wiring layers electrically insulated from each other by a polyimide material, and an intermediate layer made of an inorganic material and arranged between the ceramic section and the wiring layer section.

13 Claims, 1 Drawing Sheet

MULTILAYER WIRING SUBSTRATES

This application is a continuation of application Serial No. 07/401,115, filed Sep. 1, 1989 is now abandoned.

BACKGROUND OF THE INVENTION

The present invention relates to a multilayer wiring substrate.

In depositing multiple fine wiring layers over a glass ceramic layer, insulated with a polyimide resin layer, in a conventional multilayer wiring substrate, the adhesion of the polyimide resin layer is strengthened by coating the glass ceramic layer with a silane-based adhesion promoter or the like.

The silane-based adhesion promoter coat, however, by itself cannot provide strong enough adhesion between the glass ceramic layer and the polyimide resin layer. This entails the disadvantage that, along with a growth in the size of multilayer wiring substrates, a stress due to the difference in thermal expansion coefficient between the glass ceramic layer and the polyimide resin layer increases and thereby invites peeling of the polyimide off the glass ceramics.

An object of the invention is, therefore, to provide a multilayer wiring substrate free from the above-mentioned disadvantage of the conventional substrate.

SUMMARY OF THE INVENTION

According to an aspect of the invention, there is provided a multilayer wiring substrate which comprises: a glass ceramic section; a wiring layer section having a plurality of wiring layers insulated from each other by a polyimide material; and an intermediate layer made of an inorganic material and arranged between the ceramic section and the wiring layer section.

BRIEF DESCRIPTION OF THE DRAWINGS

Other features and advantages of the invention will become more apparent from the following detailed description when taken in conjunction with the accompanying drawings in which.

DETAILED DESCRIPTION OF THE PREFERRED EMBODIMENTS OF THE INVENTION

Figure 1:
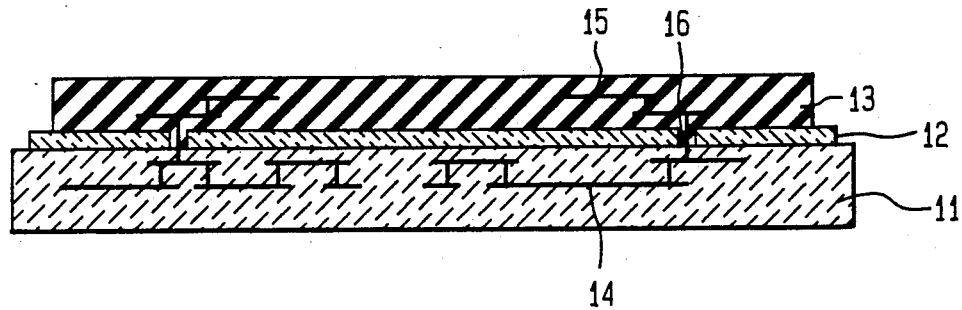
FIG. 1 shows a cross-sectional view of a first embodiment of the invention.

Referring to FIG. 1, a first embodiment of the invention comprises a glass ceramic section 11, gold conductive wiring layers 14 formed within the section 11, a multilayer wiring section 13 formed over the section 11, gold conductive wiring layers 15 formed within the section 13 and insulated from each other by polyimide resin, and a silicon dioxide layer 12 formed between the sections 11 and 13. The layer 12, which is 1 micron thick, functions to ensure a strong adhesion between the glass ceramic and the polyimide resin. Via-holes 16 are formed in the layer 12 to electrically connect the layers 14 in the section 11 and the layers 15 in the section 13.

The layer 12 is formed over the section 11 by, for instance, the plasma CVD method and the via-holes 16 are bored by the reactive ion beam etching technique. The layer 12 may also be formed by a physical vapor depositing method, such as sputtering, and the via-holes 16 are bored by reactive ion etching, wet etching, or lifting off.

Further, what can be used for the layer 12 as an adhesive layer between the glass ceramic of the section 11 and the polyimide resin of the section 13 besides silicon dioxide include aluminum oxide, aluminum nitride, boron nitride or glass ceramic whose composition has been altered specifically to promote adhesion.

If the thermal expansion coefficient of the layer 12 sandwiched between the sections 11 and 13 is between those of the glass ceramic and the polyimide resin, the layer 12 will function not only as an adhesion-promoting layer but also to ease the stress between the two layers of materials differing in thermal expansion coefficient. Among inorganic insulating materials for the layer 12 is ceramic paste whose thermal expansion coefficient can be adjusted with various additives. In order to ensure an adequate functioning of this layer to ease the stress, it is important to so form the layer 12 as not to let the sections 11 and 13 be connected to or come into contact with each other in any peripheral part of the substrate.

Figure 2:
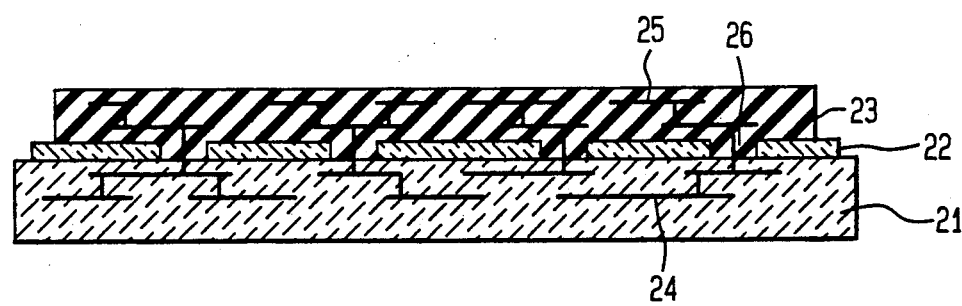
FIG. 2 shows a cross-sectional view of a second embodiment of the invention.

Referring now to FIG. 2, in a second embodiment of the invention, a glass ceramic section 21 and a polyimide multilayer wiring section 23 are structured similarly to the counterparts of the first embodiment, and include conductive wiring layers 24 and 25, respectively. Sandwiched between the sections 21 and 23 is a stress-easing layer 22 composed of multilayer plating of gold and palladium.

This stress-easing layer 22 comprises a chromium-sputtered film 1,000 Å thick, a palladium-sputtered film 1,000 Å thick, a gold-plated film 5 $\mu$m thick and a palladium-plated film 0.5 $\mu$m thick. Between the section 21 and the layer 22, the chromium-sputtered film serves as an adhesive layer, and between the layer 22 and the section 23, the palladium-plated film does. The stress arising from the difference in thermal expansion coefficient between the sections 21 and 23 is eased by the gold-plated film provided in the layer 22.

Via-holes 26 are bored at those portions of the layer 22 electrically connecting the layers 24 in the section 21 and the layers 25 in the section 23.

The whole stress easing layer 22 except the via-holes 26 consists of a layer, only the portions for the via-holes 26 of which are open, or a fine mesh layer and, if connected to the ground potential of a power supply unit, can also be used for the impedance matching of signal wiring layers.

The following metals, besides those used in this embodiment, can be used to compose the stress-easing layer 22: titanium, tungsten or Nichrome sputtering in place of the chromium sputtering; platinum or nickel sputtering in place of the palladium sputtering; copper plating in place of the gold plating; and nickel or chromium plating in place of the palladium plating.

In this embodiment, too, in order to ensure adequate stress easing, it is important to so form the layer 22 as not to let the section 21 and the section 23 be connected to or come into contact with each other in any peripheral part of the substrate.

What is claimed is:

1. A multilayer wiring substrate comprising:
   a glass ceramic section;
   a wiring layer section having a plurality of wiring layers electrically insulated from each other by a polymide material; and an intermediate layer made of an inorganic material which ensures a strong adhesion between said ceramic section and said wiring layer section wherein the width and length of the intermediate layer is different from the width and length of said ceramic section and the width and length of said wiring layer section so that no peripheral edges of said intermediate layer come into contact with any peripheral edges of said ceramic section and said wiring layer section.

2. The multilayer wiring substrate as claimed in claim 1, wherein said inorganic material is an electrical insulator.

3. The multilayer wiring substrate as claimed in claim 1, wherein said inorganic material is a metal.

4. The multilayer wiring substrate as claimed in claim 1, wherein the thermal expansion coefficient of said intermediate layer is between the thermal expansion coefficient of the glass ceramic of said glass ceramic section and the thermal expansion coefficient of the polymide material in said wiring layer section.

5. The multilayer wiring substrate as claimed in claim 1, wherein said inorganic material is silicon dioxide.

6. The multilayer wiring substrate as claimed in claim 1, wherein said inorganic material is selected from the group consisting of aluminum oxide, aluminum and boron nitride.

7. The multilayer wiring substrate as claimed in claim 1, wherein said glass ceramic section has at least one wiring layer therein.

8. The multilayer wiring substrate as claimed in claim 7, wherein said intermediate layer has at least one via-hole to respectively electrically connect at least one wiring layer in said glass ceramic section and at least one wiring layer in said wiring layer section.

9. The multilayer substrate as claimed in claim 1, wherein said glass ceramic section has a plurality of wiring layers therein and said intermediate layer has a plurality of via-holes to respectively electrically connect the wiring layers in said wiring layer section and the wiring layers in said glass ceramic section.

10. The multilayer wiring substrate as claimed in claim 1, wherein said intermediate layer is composed of a multilayer plating including gold and pallladium.

11. The multilayer wiring substrate as claimed in claim 1, wherein said intermediate layer includes a chromium-sputtered film, a palladium-sputtered film, a gold-plated film, and a palladium-plated film.

12. The multilayer wiring substrate as claimed in claim 11, wherein said chromium-sputtered film is 1,000 Å in thickness, said palladium-sputtered film is 1,000 Å in thickness, said gold-plated film is 5 $\mu$ in thickness, and said palladium-plated film is 0.5 $\mu$ in thickness.

13. The multilayer wiring substrate as claimed in claim 1, wherein said intermediate layer is a multifilm layer including: a sputtered film selected from the group consisting of titanium, tungsten and Nichrome; a sputtered film selected from the group consisting of platinum and nickle; a copper-plated film; and a plated film selected from the group consisting of nickel or chromium.

* * * * *